United States Patent
Kondoh

(10) Patent No.: US 8,148,054 B2
(45) Date of Patent: Apr. 3, 2012

(54) IMMERSION MULTIPLE-EXPOSURE METHOD AND IMMERSION EXPOSURE SYSTEM FOR SEPARATELY PERFORMING MULTIPLE EXPOSURE OF MICROPATTERNS AND NON-MICROPATTERNS

(75) Inventor: Takehiro Kondoh, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 929 days.

(21) Appl. No.: 12/140,653

(22) Filed: Jun. 17, 2008

(65) Prior Publication Data

US 2008/0311529 A1    Dec. 18, 2008

(30) Foreign Application Priority Data

Jun. 18, 2007    (JP) .................. 2007-160467

(51) Int. Cl.
*G03F 7/26*    (2006.01)

(52) U.S. Cl. ....................... 430/394; 430/322

(58) Field of Classification Search .................. 430/311, 430/394
See application file for complete search history.

(56) References Cited

U.S. PATENT DOCUMENTS

| | | | |
|---|---|---|---|
| 2006/0103818 | A1 | 5/2006 | Holmes et al. |
| 2006/0250588 | A1 | 11/2006 | Brandl |
| 2008/0218715 | A1* | 9/2008 | Hatano et al. .................. 355/53 |

FOREIGN PATENT DOCUMENTS

| | | |
|---|---|---|
| JP | 2000-349010 | 12/2000 |
| JP | 2005-353763 | 12/2005 |

* cited by examiner

*Primary Examiner* — Kathleen Duda

(74) *Attorney, Agent, or Firm* — Finnegan, Henderson, Farabow, Garrett & Dunner, L.L.P.

(57) ABSTRACT

This invention discloses an immersion multiple-exposure method including a first exposure step of performing, using a first mask, immersion exposure of a photoresist film formed on a substrate, a cleaning step of clearing the surface of the substrate, and a second exposure step of performing immersion exposure of the photoresist film using a second mask. No heating process is performed between the first exposure step and the second exposure step.

10 Claims, 4 Drawing Sheets

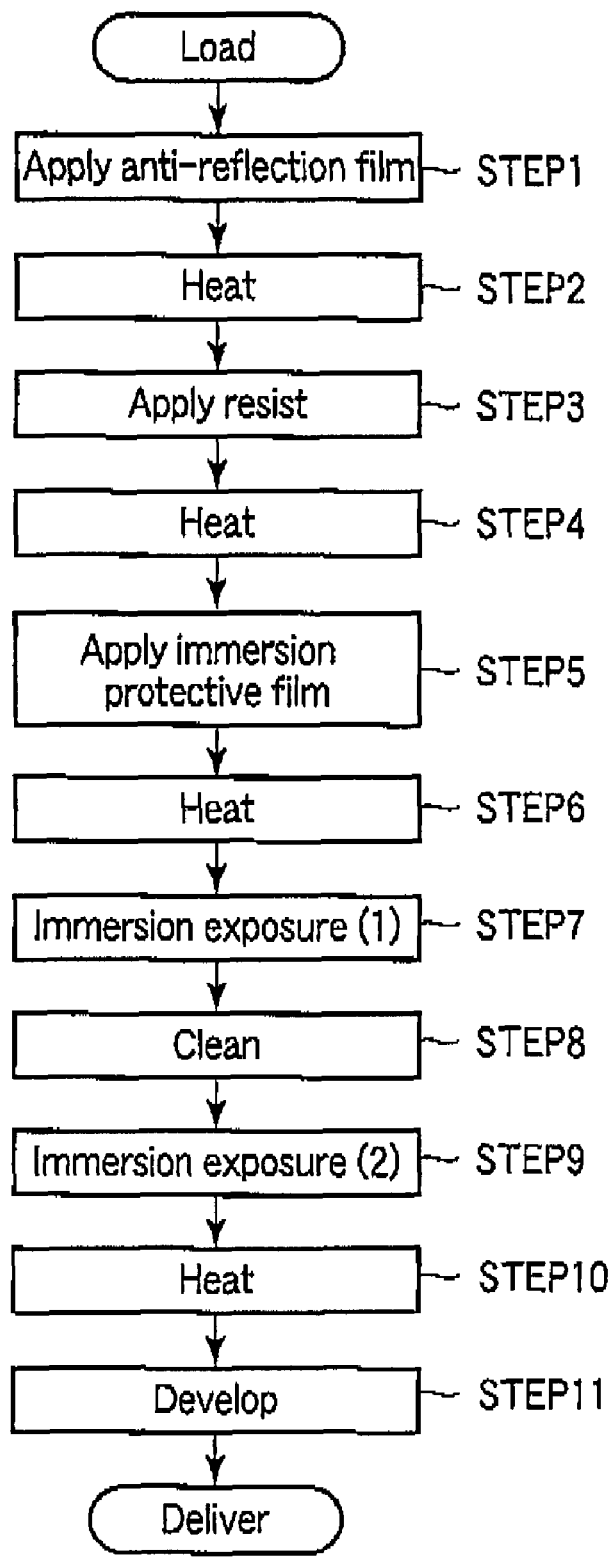
F I G. 1

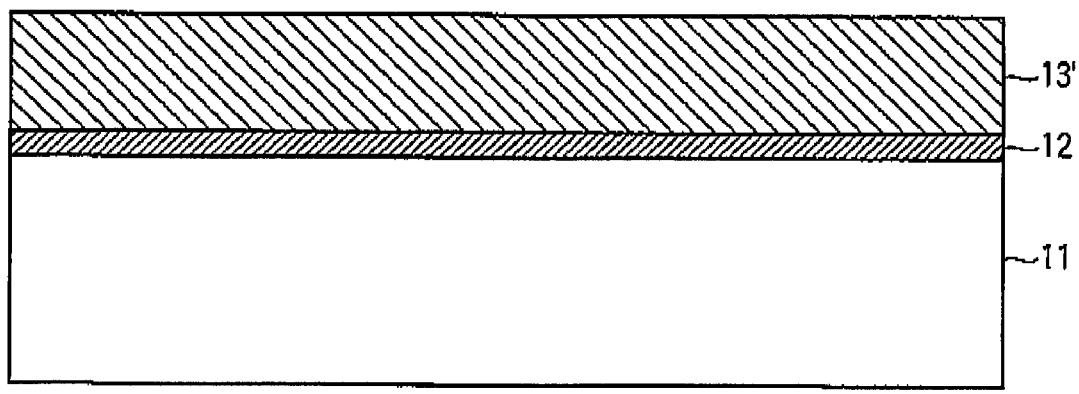
F I G. 6

US 8,148,054 B2

IMMERSION MULTIPLE-EXPOSURE METHOD AND IMMERSION EXPOSURE SYSTEM FOR SEPARATELY PERFORMING MULTIPLE EXPOSURE OF MICROPATTERNS AND NON-MICROPATTERNS

CROSS-REFERENCE TO RELATED APPLICATIONS

This application is based upon and claims the benefit of priority from prior Japanese Patent Application No. 2007-160467, filed Jun. 18, 2007, the entire contents of which are incorporated herein by reference.

BACKGROUND OF THE INVENTION

1. Field of the Invention

The present invention relates to an immersion exposure technique used in manufacturing a semiconductor device and, for example, to an immersion multiple-exposure method and immersion exposure system for separately performing multiple exposure of micropatterns and non-micropatterns.

2. Description of the Related Art

In a recently proposed technique, in forming a highly integrated semiconductor circuit device, patterns to be exposed are divided into micropatterns and non-micropatterns and double-exposed to a photoresist film under illumination conditions optimum for the respective patterns (e.g., Jpn. Pat. Appln. KOKAI Publication No. 2000-349010). Immersion exposure will be described as an example. First, an ArF organic anti-reflection material is applied to the element formation surface (major surface) of a wafer by spin coating and baked at 215° C. for 1 minute, thereby forming an 80-nm-thick anti-reflection film. Then, an ArF positive resist is applied to the anti-reflection film by spin coating and baked at 90° C. for 1 minute, thereby forming a 400-nm-thick photoresist film. Next, an immersion exposure protective film is applied to the photoresist film by spin coating and baked at 90° C. for 1 minute.

An ArF excimer laser immersion exposure apparatus exposes the wafer having the stacked structure of the anti-reflection film, photoresist film, and immersion protective film using a halftone mask having a transmittance of 6% under conditions of NA=0.78 and 2/3 annular illumination. The wafer is exposed again using a halftone mask having a transmittance of 6% under conditions of NA=0.92 and σ0.97. The wafer is baked at 100° C. for 1 minute and developed in a 2.38-wt % aqueous solution of tetramethylammonium hydroxide (TMAH), thereby forming a resist pattern.

When the resist pattern formed by the above-described double-exposure was inspected by an optical defect inspection apparatus (2360 available from KlA), a number of defects were found, and the defect density was about 0.7 pieces/cm$^2$. These defects are presumably produced upon double-exposure in immersion exposure because dust particles produced in the first exposure step stick to the immersion protective film and shield the irradiation light in the second exposure step.

BRIEF SUMMARY OF THE INVENTION

According to an aspect of the present invention, there is provided an immersion multiple-exposure method of performing immersion exposure twice or more for a photoresist film formed on a substrate, in which at least one step of cleaning the surface of the substrate is inserted between the exposure steps of the immersion multiple-exposure process.

According to another aspect of the present invention, there is provided an immersion exposure system for performing immersion exposure twice or more for a photoresist film, comprising a cleaning unit which cleans the substrate between the exposure steps of the immersion multiple-exposure process.

BRIEF DESCRIPTION OF THE SEVERAL VIEWS OF THE DRAWING

FIG. 1 is a process flowchart illustrating the procedure of loading a wafer to an exposure step and delivering it after a development step so as to explain an immersion multiple-exposure method and immersion exposure system according to an embodiment of the present invention;

FIG. 6 is a sectional view showing a wafer as a target of immersion double-exposure so as to explain another embodiment of the present invention.

DETAILED DESCRIPTION OF THE INVENTION

Figure 2:
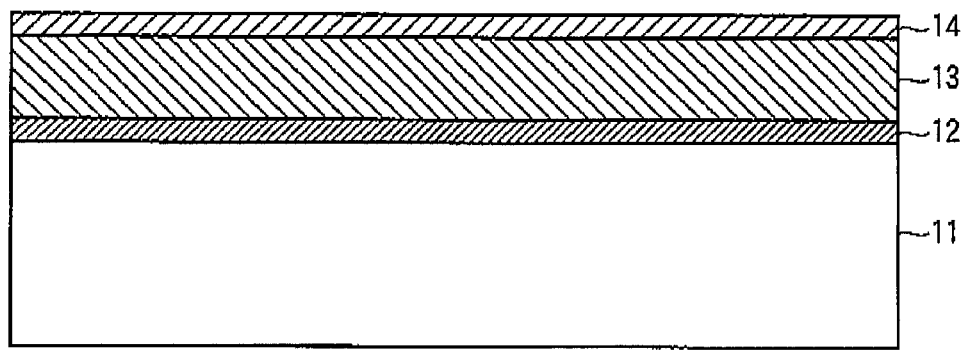
FIG. 2 is a sectional view showing a wafer as a target of immersion double-exposure so as to explain the immersion multiple-exposure method and immersion exposure system according to the embodiment of the present invention.
Figure 3:
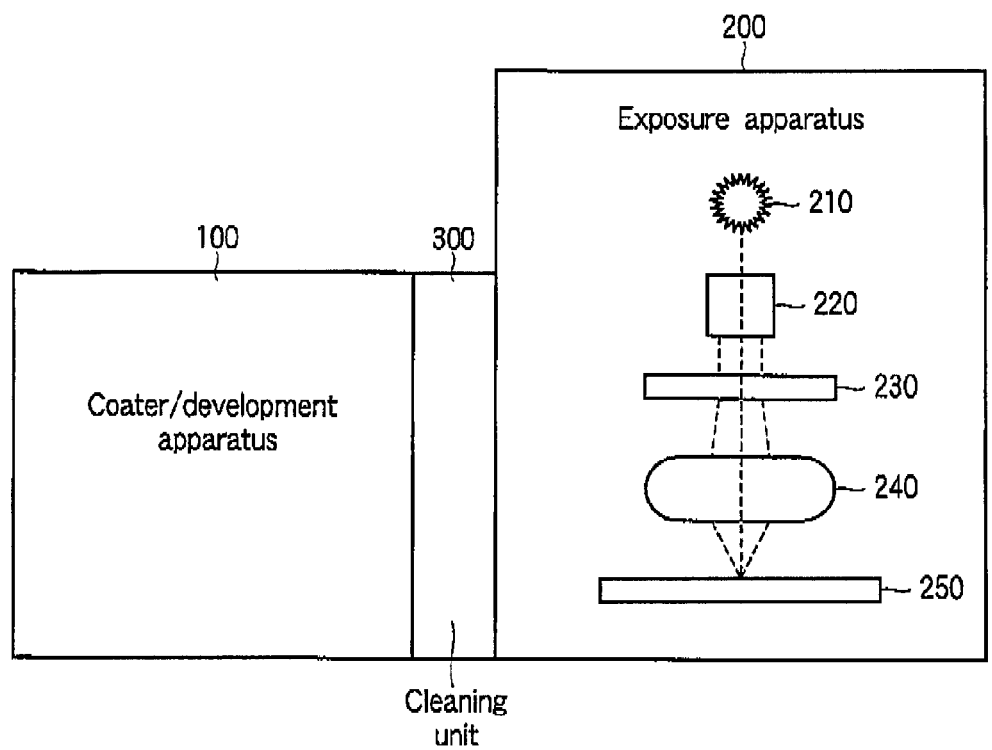
FIG. 3 is a block diagram showing the schematic arrangement of an immersion exposure system so as to explain the immersion multiple-exposure method and immersion exposure system according to the embodiment of the present invention.

FIGS. 1 to 3 are views for explaining an immersion multiple-exposure method and immersion exposure system according to an embodiment of the present invention. FIG. 1 is a process flowchart illustrating the procedure of loading a wafer (semiconductor substrate) to an exposure step and delivering it after a development step. FIG. 2 is a sectional view of the water as a target of immersion double-exposure. FIG. 3 is a block diagram showing the schematic arrangement of the immersion exposure system.

First, an ArF organic anti-reflection material is applied to the element formation surface (major surface) of a wafer 11 by spin coating (STEP 1) and heated (STEP 2), e.g., baked at 215° C. for 1 minute, thereby forming an anti-reflection film 12 having a thickness of about 80 nm.

The wafer 11 is loaded into a coater/development apparatus 100. An ArF positive resist is applied to the anti-reflection film 12 by spin coating (STEP 3) and heated (STEP 4), e.g., baked at 90° C. for 1 minute, thereby forming a photoresist film 13 having a thickness of about 400 nm.

Next, an immersion exposure protective material is applied to the photoresist film 13 by spin coating (STEP 5) and heated (STEP 6), e.g., baked at 90° C. for 1 minute, thereby forming an immersion protective film 14.

The wafer 11 having the stacked structure of the anti-reflection film 12, photoresist film 13, and immersion protective film 14 is transferred into an exposure apparatus 200 and exposed using a first halftone mask having a transmittance of 6% under conditions of NA=0.78 and ⅔ annular illumination (STEP 7). The exposure apparatus 200 is, e.g., an ArF excimer laser immersion exposure apparatus including an illumination light source 210, condenser optical system 220, reticle stage 230, projection optical system 240, and wafer stage 250. The condenser optical system 220 condenses irradiation light from the illumination light source 210. The reticle stage 230 is arranged on the exit side of the condenser optical system 220 to accept a photomask. The projection optical system 240 is arranged under the reticle stage 230. The wafer stage 250 is arranged under the projection optical system 240 to accept the wafer 11.

The wafer 11 that has undergone immersion exposure is transferred into a cleaning unit 300 to clean the surface using pure or ultrapure water (referred to as ultrapure water hereinafter) (STEP 8). The cleaning unit 300 is provided at the interface portion between the coater/development apparatus and the exposure apparatus 200. The cleaning unit 300 cleans the wafer 11 while rotating it and spraying ultrapure water.

The wafer 11 that has undergone surface cleaning is transferred into the exposure apparatus 200 again and loaded on the wafer stage 250. The wafer 11 is exposed using a second halftone mask (having a pattern different from that of the first halftone mask) having a transmittance of 6% under conditions of NA=0.92 and σ0.97 (STEP 9) and heated (STEP 10), e.g., baked at 100° C. for 1 minute. The exposed water 11 is transferred into the coater/development apparatus 100 and developed in a 2.38-wt % aqueous solution of tetramethylammonium hydroxide (TMAH), thereby forming a resist pattern (STEP 11).

A workpiece is processed, e.g., an oxide film or metal film is etched using the resist pattern as at least part of a mask, thereby forming various semiconductor elements, interconnections, and the like.

According to the above-described immersion multiple-exposure method, it is possible to remove dust particles that are produced in the first exposure step and stick to the immersion protective film 14 by surface cleaning using ultrapure water. This allows pattern defects to be reduced.

According to the above-described immersion exposure system, the cleaning unit 300 is provided at the interface portion between the coater/development apparatus 100 and the exposure apparatus 200. It is therefore possible to efficiently clean the photoresist film and also minimize contamination during transfer between the apparatuses.

According to the above-described semiconductor device manufacturing method, it is possible to reduce pattern defects in the photoresist film. This suppresses a decrease in the yield.

Figure 4:
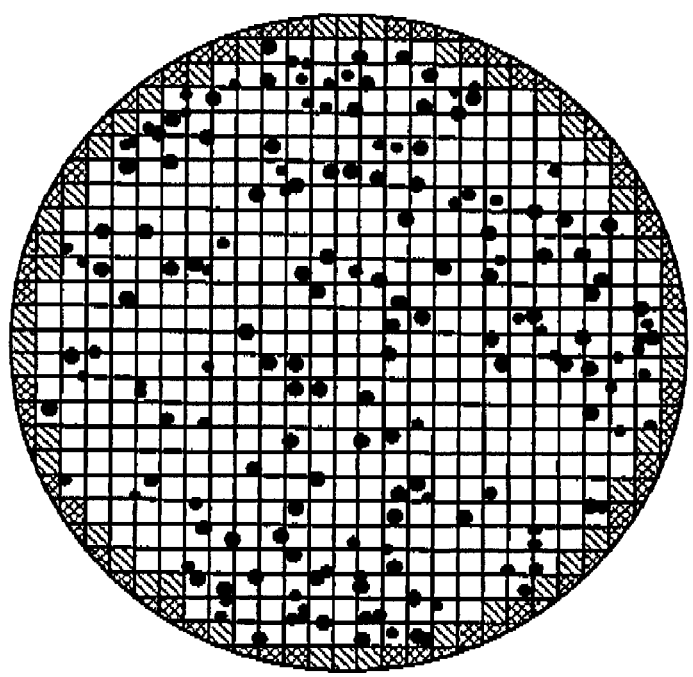
FIG. 4 is a plan view showing a result obtained by inspecting, using an optical defect inspection apparatus, a pattern formed by the immersion multiple-exposure method according to the embodiment of the present invention.
Figure 5:
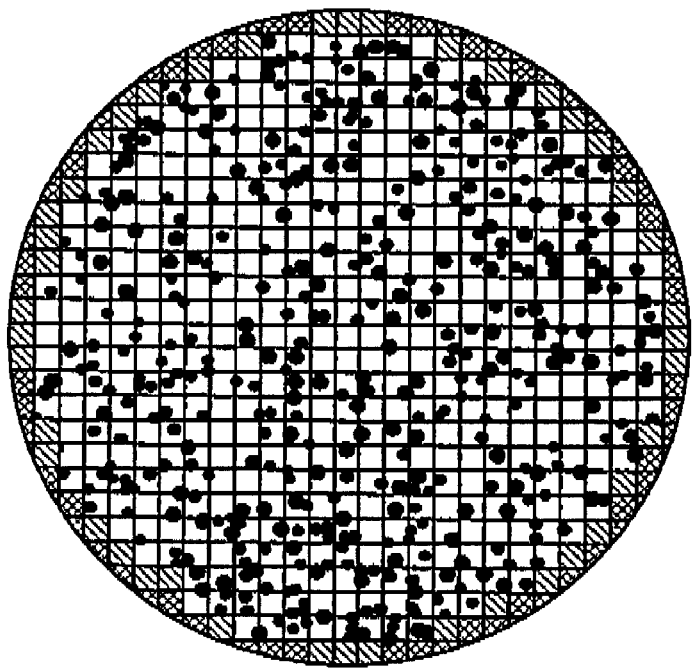
FIG. 5 is a plan view showing a result obtained by inspecting, using an optical defect inspection apparatus, a pattern formed by a conventional immersion multiple-exposure method.

The pattern formed by the above-described manufacturing method was subjected to defect inspection by an optical defect inspection apparatus. The defect density was about 0.3 pieces/cm$^2$, as shown in FIG. 4. That is, the number of defects obviously decreased as compared to the defect density (0.7 pieces/cm$^2$) in the conventional manufacturing method shown in FIG. 5.

In the above-described embodiment, the immersion protective film 14 is formed on the photoresist film 13. However, the immersion protective film is unnecessary if a protective film-less type photoresist film 13' is used, as shown in FIG. 6. The remaining manufacturing methods and manufacturing conditions are the same as in the above embodiment.

In the above embodiment, immersion double-exposure has been explained. However, the present invention is also applicable to immersion multiple exposure that performs exposure of a single resist surface three times or more. The effects are obtained by performing the cleaning process at least once between two of the plurality of exposure processes. The cleaning process may be done between the respective exposure processes, as a matter of course.

In the above-described embodiment, the first and second halftone masks have different patterns. However, the present invention is also applicable to multiple exposure using a single mask having a single pattern, and almost the same functions and effects can be obtained.

As described above, according to one aspect of the present invention, it is possible to obtain an immersion multiple-exposure method and immersion exposure system capable of reducing pattern defects in multiple exposure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An immersion multiple-exposure method comprising:
   forming a photoresist film on a substrate;
   performing first immersion exposure of the photoresist film using a first mask;
   cleaning a surface of the substrate with the photoresist film at least once; and
   performing second immersion exposure of the photoresist film after cleaning the surface of the substrate with the photoresist film, using a second mask.

2. The method according to claim 1, wherein the cleaning is done using pure water.

3. The method according to claim 1, wherein the cleaning is done while rotating the substrate and spraying pure water.

4. The method according to claim 1, further comprising, after forming the photoresist film before performing the first immersion exposure, forming an immersion protective film on the photoresist film.

5. The method according to claim 4, wherein in the cleaning, a surface of the immersion protective film formed on the photoresist film is cleaned.

6. The method according to claim 1, wherein the first mask and the second mask have different patterns.

7. The method according to claim 1, wherein the first immersion exposure and the second immersion exposure are performed under different conditions.

8. The method according to claim 1, wherein the substrate includes a wafer and an anti-reflection film formed on a major surface of the wafer, and the photoresist film is formed on the anti-reflection film.

9. The method according to claim 1, wherein the cleaning is performed immediately after performing the first immersion exposure, and the second immersion exposure is performed immediately after the cleaning.

10. The method according to claim 1, wherein no heating process is included between the first immersion exposure and the second immersion exposure.

* * * * *